United States Patent [19]

Moser

[11] 4,119,918
[45] Oct. 10, 1978

[54] AUTO ZERO CIRCUIT

[75] Inventor: Richard A. Moser, Toledo, Ohio

[73] Assignee: Helm Instrument Company, Toledo, Ohio

[21] Appl. No.: 793,149

[22] Filed: May 2, 1977

[51] Int. Cl.² ............................................. H03K 5/08
[52] U.S. Cl. .................................. 328/165; 307/359; 307/260; 328/175
[58] Field of Search ............... 307/237, 230, 354, 358, 307/359, 362, 260; 328/162, 163, 165, 167, 169, 171, 175

[56] References Cited

U.S. PATENT DOCUMENTS 3,864,967  2/1975  Krenzel ............................ 328/165 X

*Primary Examiner*—John Zazworsky
*Attorney, Agent, or Firm*—William J. Clemens

[57] ABSTRACT

A method and apparatus for controlling the feedback path in a signal conditioning system. An input signal having signal pulses superimposed on a first d. c. voltage level is applied to a signal conditioner to generate conditioned signal pulses superimposed on a second d. c. voltage level established by a feedback circuit. A first comparator generates a constant magnitude output pulse during the time that the magnitude of a signal pulse exceeds the magnitude of a first reference voltage. The output signal is differentiated and a second comparator generates a control signal during the time the magnitude of the differentiated signal exceeds the magnitude of a second reference voltage. A transistor switch is responsive to the control signal for interrupting the feedback path during which time capacitor means continues to establish the second d. c. voltage level while the signal pulse is conditioned by the signal conditioner.

10 Claims, 4 Drawing Figures

AUTO ZERO CIRCUIT

BACKGROUND OF THE INVENTION

1. Field of the Invention

The present invention relates to circuitry for controlling the feedback path in a signal conditioning system.

2. Description of the Prior Art

There are many applications where a transducer generates a signal pulse which is utilized to drive a display or recording instrument. The signal pulse is usually superimposed on a d.c. level but the d.c. level is not constant since it is subject to electrical noise and signal drift. If the information to be displayed or recorded is proportional to the magnitude of the signal pulse, it is desirable to eliminate the d.c. level. A signal conditioning system is connected between the transducer and the instrument and has a feedback circuit for subtracting the d.c. level from the signal from the transducer. When the signal pulse is generated, the feedback path is interrupted to allow the signal pulse to pass through to the instrument.

One circuit which can be utilized to control the feedback path of a signal conditioner is disclosed in U.S. Pat. No. 3,772,604, issued on Nov. 13, 1973 to Walter R. Hogg and Wallace H. Coulter and entitled "Non-Rectifying Clamps." This circuit functions to maintain the output of a signal conditioner at a desired d.c. voltage level in the absence of signal pulses having magnitudes which exceed a predetermined reference voltage. The feedback circuit includes an operational amplifier connected between the signal conditioner output and input for generating a negative feedback signal.

A comparator compares the magnitude of the signal conditioner output signal with the magnitude of a reference voltage. When the output signal magnitude is below the reference voltage magnitude, the comparator will turn on an electronic switch to connect the signal conditioner output to the amplifier input to generate the feedback signal. When the output signal magnitude exceeds the reference voltage magnitude, the comparator will turn off the switch to interrupt the feedback path. A capacitor connected across the amplifier stores a charge for maintaining the d.c. feedback signal while the path is interrupted.

There are several problems which can arise when utilizing the previously described signal conditioning system. The output of the signal conditioner is coupled to the input of the comparator through a RC differentiator network. This circuit provides a timing out function to reconnect the feedback circuit to prevent the signal conditioning system from locking up with the feedback path interrupted. However, the operation of the circuitry is dependent upon the types of signals applied to the RC network. For example, if a noise signal has partially or fully charged the coupling capacitor of the RC network, a relatively low magnitude signal pulse would not be coupled to the comparator to turn off the electronic switch. Therefore, the feedback path would not be interrupted and the pulse signal would be eliminated from the output of the signal conditioner. Furthermore, if the signal pulse has a relatively low magnitude and a relatively long duration, the coupling capacitor would rapidly become charged and the comparator would turn on the electronic switch before the signal pulse terminated. Therefore, it can be seen that the interruption of the feedback path is dependent upon the duration of the signal pulse, which is desirable, and upon the magnitude and rise time of the signal pulse, which is not desirable as much of the signal pulse may be lost.

SUMMARY OF THE INVENTION

The present invention concerns means for controlling the feedback path in a signal conditioning system. A negative feedback circuit is connected to a signal conditioner circuit for eliminating the d.c. level of the input signal to the signal conditioner. Means for detecting a signal pulse and interrupting the feedback path are provided such that the signal pulse can be passed to the output of the signal conditioner.

The feedback circuit includes an amplifier having an input connected to the output of the signal conditioner and an output connected to the input of the signal conditioner for generating a negative feedback signal. A first comparator compares the magnitude of the signal conditioner output signal with the magnitude of a first reference voltage to detect signal pulses. The comparator generates a constant magnitude output signal during the time the magnitude of the signal conditioner output signal exceeds the first reference voltage magnitude. The first comparator output signal is differentiated by an RC network at an input to a second comparator. The second comparator compares the magnitude of the differentiated signal with the magnitude of a second reference voltage to generate a constant magnitude output signal. The duration of the second comparator output signal is determined by the length of the detected signal pulse or the RC time constant whichever is shorter. The second comparator output signal is utilized to turn on a transistor switch to ground the input of the feedback amplifier and interrupt the feedback path. During the time the feedback path is interrupted, a charge storage means continues to supply the d.c. feedback signal to the input of the signal conditioner. Thus, the interruption of the feedback path is not dependent upon the magnitude and rise time of the detected signal pulse and does not exceed a predetermined time so that the established d.c. signal level is maintained.

It is an object of the present invention to provide a signal conditioning system which responds to signal pulses superimposed on a d.c. signal level and not to the d.c. signal level.

It is another object of the present invention to increase the range of signal pulses to which a signal conditioning system responds.

DESCRIPTION OF THE PREFERRED EMBODIMENT

The present invention concerns a signal conditioning system which can be utilized to condition signals generated by a strain gage transducer for use in load monitoring equipment. A signal conditioner circuit receives a transducer signal on line 12 and generates an output signal on a line 13 to the monitoring equipment (not shown). A feedback circuit 14 has an input connected to the line 13 and generates a negative feedback signal on a line 15 to the circuit 11. The feedback signal is subtracted from the input signal to generate a d.c. output signal with an average magnitude which represents a predetermined load or no load signal from the transducer. The feedback reduces the fluctuations in the output signal due to noise or spurious signals at the input to the signal conditioner circuit.

When a change in load occurs, the transducer generates a load signal having a magnitude proportional to the magnitude of the load. The feedback circuit must be interrupted so that the load signal can be conditioned and passed to the load monitoring equipment for an indication of the magnitude of the sensed load. A signal sensor circuit 16 has an input connected to the line 13 and is responsive to the magnitude of the input signal for sensing a load signal and generating a control signal in response thereto. The control signal is generated on a line 17 to the feedback circuit 14 to interrupt the feedback path until the load signal has been conditioned by the circuit 11.

Figure 1:
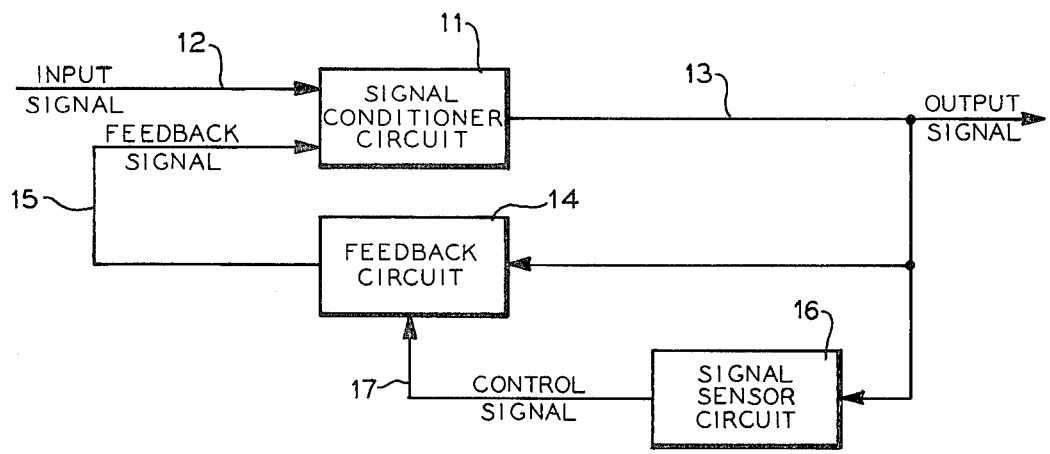
FIG. 1 is a block diagram of a signal conditioning circuit including means for interrupting the feedback path to pass signals having a predetermined magnitude.
Figure 2:
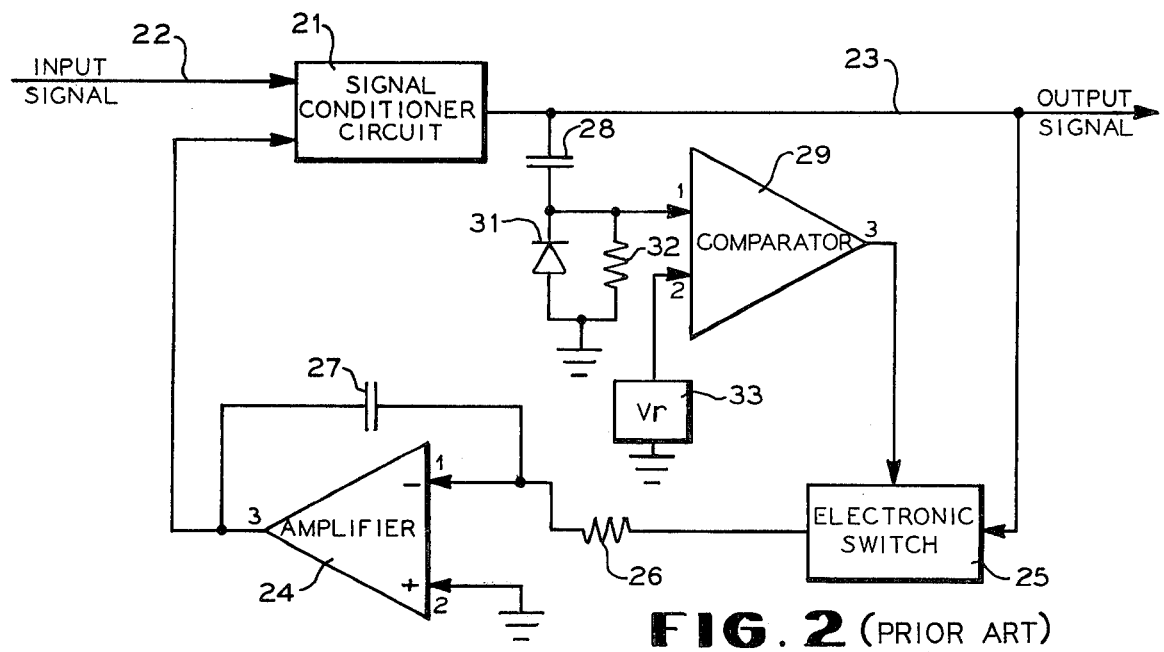
FIG. 2 is a partial schematic, partial block diagram of a signal conditioning circuit according to the prior art.

There is shown in FIG. 2, a partial schematic, partial block diagram of a prior art signal conditioning system. A signal conditioner circuit 21, similar to the circuit 11 of FIG. 1, receives an input signal on a line 22 and generates an output signal on a line 23. A feedback circuit includes an operational amplifier 24 having an inverting input 24-1 connected to the line 23 through a series connected electronic switch 25 and a resistor 26. The switch is normally closed to apply the output signal to the amplifier which generates a feedback signal at an output 24-3 connected to an input of the signal conditioner circuit 21. A noninverting input 24-2 is connected to the system ground potential and a capacitor 27 is connected between the input 24-1 and the output 24-3 such that the amplifier functions as an integrator to integrate the difference between the input signals. Since the input 24-2 is at the ground potential, the output signal will be integrated and applied to the signal conditioner circuit. Thus, any d.c. level of the input signal will be subtracted and the d.c. level of the output signal will be the potential applied to the input 24-2 which is the system ground potential.

When it is desired to pass a load signal, the feedback path must be interrupted without disturbing the d.c. signal level. A capacitor 28 is connected between an input 29-1 of a comparator 29 and the output line 23. A diode 31 has a cathode connected to the input 29-1 and an anode connected to the system ground potential. Since the voltage across a capacitor cannot change instantaneously, any signal appearing on the line 23 will also appear at the comparator input 29-1. If the signal has a negative potential with respect to the ground potential, current will flow through the diode 31 and the resistor 32 to quickly charge the capacitor 28 and return the input 29-1 to the ground potential. If the signal has a positive potential with respect to the ground potential, the capacitor 28 will charge only through the resistor 32 so that the input 29-1 is returned to the ground potential more slowly. Thus, the diode 31 functions as a clamp for negative potential signals and the capacitor 28 and the resistor 32 function as a differentiator for the positive potential signal.

The comparator 29 also has an input 29-2 which is connected to a positive potential power supply 33 and an output 29-3 connected to the switch 25. The power supply 33 generates a reference voltage Vr which is compared in magnitude with the signal at the input 29-1. If the magnitude of the signal at the input 29-1 is less than the magnitude of the reference voltage Vr, the comparator 29 generates a signal to maintain the switch 25 in a turned on state to connect the line 23 to the input 24-1 of the amplifier 24. If the magnitude of the signal at the input 29-1 is greater than the magnitude of the reference voltage Vr, the comparator 29 generates a signal to maintain the switch 25 in a turned off state to disconnect the line 23 from the amplifier input 24-1. When the switch 25 is turned off, the charge stored on the capacitor 27 will maintain the d.c. feedback signal while the load signal is conditioned by the circuit 21. When the capacitor 28 has charged to the reference voltage level, or the load signal terminates, whichever occurs first, the comparator 29 will turn on the switch 25 to reconnect the feedback circuit.

In summary, the prior art signal conditioning system of FIG. 2 utilizes a negative feedback circuit to eliminate the d.c. component from input signals and suppress unwanted noise or voltage drifts. Any input signal having a magnitude less than the magnitude of the reference voltage Vr is subjected to the negative feedback and is eliminated or greatly reduced in magnitude. Any input signal with a magnitude greater than the magnitude of the referenced voltage Vr is detected and the feedback path is interrupted while the input signal is conditioned.

There are several problems which can occur when using the prior art circuit of FIG. 2. For example, if a noise signal has partially or fully charged the capacitor 28, a low amplitude load signal occurring immediately thereafter could not couple into the comparator to turn off the switch 25. Therefore, the feedback path would not be interrupted and the load signal would be filtered from the output of the signal conditioner. Furthermore, if the load signal is a relatively small amplitude pulse of long duration, the capacitor 28 would rapidly become fully charged and the comparator would turn off the switch 25. Although the leading edge of the load signal would be present at the output, the feedback path would be provided and would cancel the remainder of the load signal. It can be seen from the preceding examples that the proper operation of the prior art circuit of FIG. 2 is limited by the types of load signals which are applied to the signal conditioner.

Figure 3:
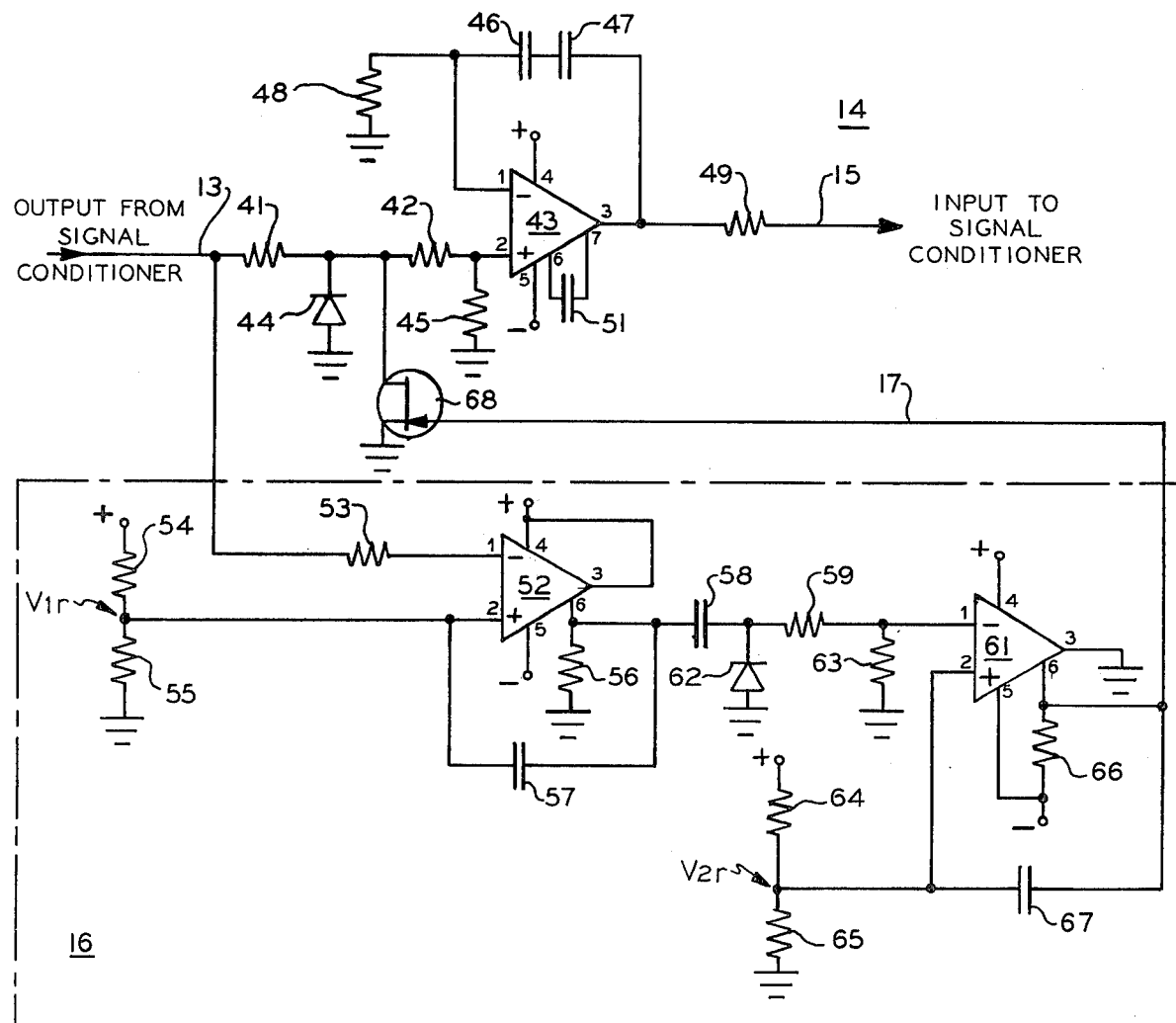
FIG. 3 is a partial schematic, partial block diagram of the signal conditioning circuit of FIG. 1 according to the present invention.

The present invention is concerned with increasing the range of load signals which can be successfully applied to the signal conditioner. There is shown in FIG. 3 a schematic diagram of the feedback circuit 14 of FIG. 1 according to the present invention. The output signal line 13 is connected through a pair of resistors 41 and 42 connected in series to a noninverting input 43-2 of an operational amplifier 43. A diode 44 has a cathode connected to the junction of the resistors 41 and 42 and an anode connected to the system ground potential. A resistor 45 is connected between the input 43-2 and the system ground potential. The diode 44 functions as a clamp to maintain the signal applied to the input 43-2 at or above the system ground potential. A pair of capacitors 46 and 47 are connected in series between an inverting input 43-1 and an output 43-3 of the amplifier and the input 43-1 is connected to the system ground potential through a resistor 48. The output 43-3 is connected to the feedback signal line 15 of FIG. 1 through a resistor 49.

The amplifier 43 is similar to the amplifier 24 of FIG. 2 and functions as an integrator to generate a 100 percent feedback signal on the line 15. The amplifier 43 generates a signal which is proportional to the difference in magnitudes of the signals at the inputs 43-1 and 43-2 and is limited in magnitude to a maximum defined by a positive potential power supply (not shown) connected to a positive power input 43-4 and to a minimum defined by a negative potential power supply (not shown) connected to a negative power input 43-5. A capacitor 51 is connected between a pair of compensation inputs 43-6 and 43-7 to provide external frequency compensation.

The line 13 is also connected to an inverting input 52-1 of a voltage comparator 52 through a resistor 53. A first reference voltage V1r is applied to a noninverting input 52-2 as determined by a pair of resistors 54 and 55 connected in series between the positive potential power supply and the system ground potential. The input 52-2 is connected to the junction of the resistors which function as a voltage divider to determine the magnitude of the reference voltage. The magnitude of the reference voltage is typically selected to be two or three times the RMS value of the noise signal on the line 13 to provide an acceptable trigger level.

The comparator has a positive power input 52-4 connected to the positive potential power supply and a negative power input 52-5 connected to the negative potential power supply. The comparator generates a signal at an output 52-3 which is proportional to the difference between the magnitudes of the input signals and is limited in magnitude by the power supply potentials. However, the comparator also has a ground output 52-6 which is connected to the system ground potential through a resistor 56. The ground output is also connected to the output 52-3 through a series connected resistor and transistor switch internal to the comparator. When the output 52-3 is connected to the positive potential power supply, as shown, and the magnitude of the signal on the line 13 exceeds the magnitude of the reference voltage V1r, the transistor switch is turned on and the potential at the ground output 52-6 will change from the system ground potential to a potential intermediate the ground potential and the positive power supply potential as determined by the values of the internal resistor and the resistor 56. When the input signal level drops below the reference voltage level, the transistor switch will be turned off and the output 52-6 will return to the ground potential. Thus, the output signal from the comparator 52 is a square wave pulse constant in magnitude and its duration is determined by the time during which the input signal magnitude is greater than the reference voltage magnitude. A capacitor 57 is connected between the input 52-2 and the output 52-6 to remove any switching transients from the output signal.

The ground output 52-6 is connected through a series connected capacitor 58 and resistor 59 to an input 61-1 of a comparator 61. A diode 62 has a cathode connected to the junction of the capacitor 58 and the resistor 59 and an anode connected to the system ground potential to function as a clamp at the ground potential. A resistor 63 is connected between the input 61-1 and the system ground potential. The resistor 59 limits the input current to the comparator 52 and the resistors 59 and 63 function as a voltage divider for the input signal.

A second reference voltage V2r is applied to an input 62-2 as determined by a pair of resistors 64 and 65 connected in series between the positive potential power supply and the system ground potential. The input 61-2 is connected to the junction of the resistors which function as a voltage divider to determine the magnitude of the reference voltage. The comparator has a positive power input 61-4 connected to the positive potential power supply and a negative power input 61-5 connected to the negative potential power supply. An output 61-3 is connected to the system ground potential and a ground output 61-6 is connected to the negative potential power supply through a resistor 66.

The square wave pulse generated by the comparator 52 in response to the detection of a load signal is differentiated by the capacitor 58. The leading edge of the pulse has a magnitude which will exceed the magnitude of the reference voltage V2r, the reference voltage magnitude being selected to prevent false triggering by spurious signals. The comparator 61 will turn on its internal transistor switch to change the negative potential signal at the ground output 61-6 to the system ground potential. The internal transistor switch will be turned off when the pulse generated by the comparator 52 terminates at the end of the load signal or, if the pulse duration exceeds a time constant defined by the values of the capacitor 58 and the resistor 59, when the signal at the input 61-1 decays below the magnitude of the reference voltage V2r. Thus, the output signal generated by the comparator 61 is a square wave pulse constant in magnitude and its duration is determined by the time during which the load signal magnitude is greater than the first reference voltage V1r magnitude limited by an RC time constant. A capacitor 67 is connected between the input 61-2 and the output 61-6 to remove any switching transients from the output signal.

The ground output 61-6 of the comparator is connected to a gate of a transistor switch 68 by the control signal line 17 of FIG. 1. The switch 68 is represented as a junction field effect transistor (JFET) having a drain connected to the junction of the resistors 41 and 42 and a source connected to the system ground potential. When the ground output 61-6 is at the negative power supply potential, the transistor 68 will be turned off and any signal on the input line 13 will be applied to the amplifier input 43-2 to generate a feedback signal. When a load signal is sensed, the comparator 61 generates a control signal pulse having a magnitude at or near the ground potential to turn on the transistor 68 to ground the input 43-2 and prevent the load signal from being coupled through the amplifier 43 to the feedback line 15. During the time that the transistor 68 is turned on and the feedback path is interrupted, the capacitors 46 and 47 will maintain the d.c. feedback signal on the line 15 such that the load signal is conditioned by the signal conditioner circuit 11 of FIG. 1.

Since the transistor 68 can only approximate a short circuit to ground when it is turned on, there will be a relatively small signal at the input 43-2 which will cause a drift in the d.c. level of the feedback signal on the line 15. In order to reduce the signal drift, the resistors 42 and 45 are utilized to make the resistance of the transistor appear to be much lower than the input resistance of the amplifier 43. The values of these resistors must be selected to take into account the interaction with other circuit elements connected to the amplifier. If the total resistance of the resistors 41, 42 and 45 is too high, the signal drift is in an increasing direction and, if the total resistance is too low, the signal drift is in a decreasing direction. The resistor 42 also interacts with the resistor 48 to change the rate of decay of the charge stored on the capacitors 46 and 47. Increasing the resistance of the resistor 48 increases the rate of decay and decreasing the resistance decreases the rate of decay.

In one embodiment of the present invention, a 301 operational amplifier manufactured by the National Semiconductor Corporation, 2900 Semiconductor Dr., Santa Clara, Calif. 95051, was utilized as the amplifier 43. Each of the capacitors 46 and 47 had a value of 100 microfarads and the resistor 48 had a value of 27,000 ohms. It was found that best compromise between the rate of decay of the charge stored on the capacitors and the signal drift was achieved when each of the resistors 41, 42 and 45 and a value of 100,000 ohms.

The comparators 52 and 61 can be a MLM 311 voltage comparator manufactured by Motorola Semiconductor Products Inc., Box 20912, Phoenix, Ariz. 85036.

Figure 4:
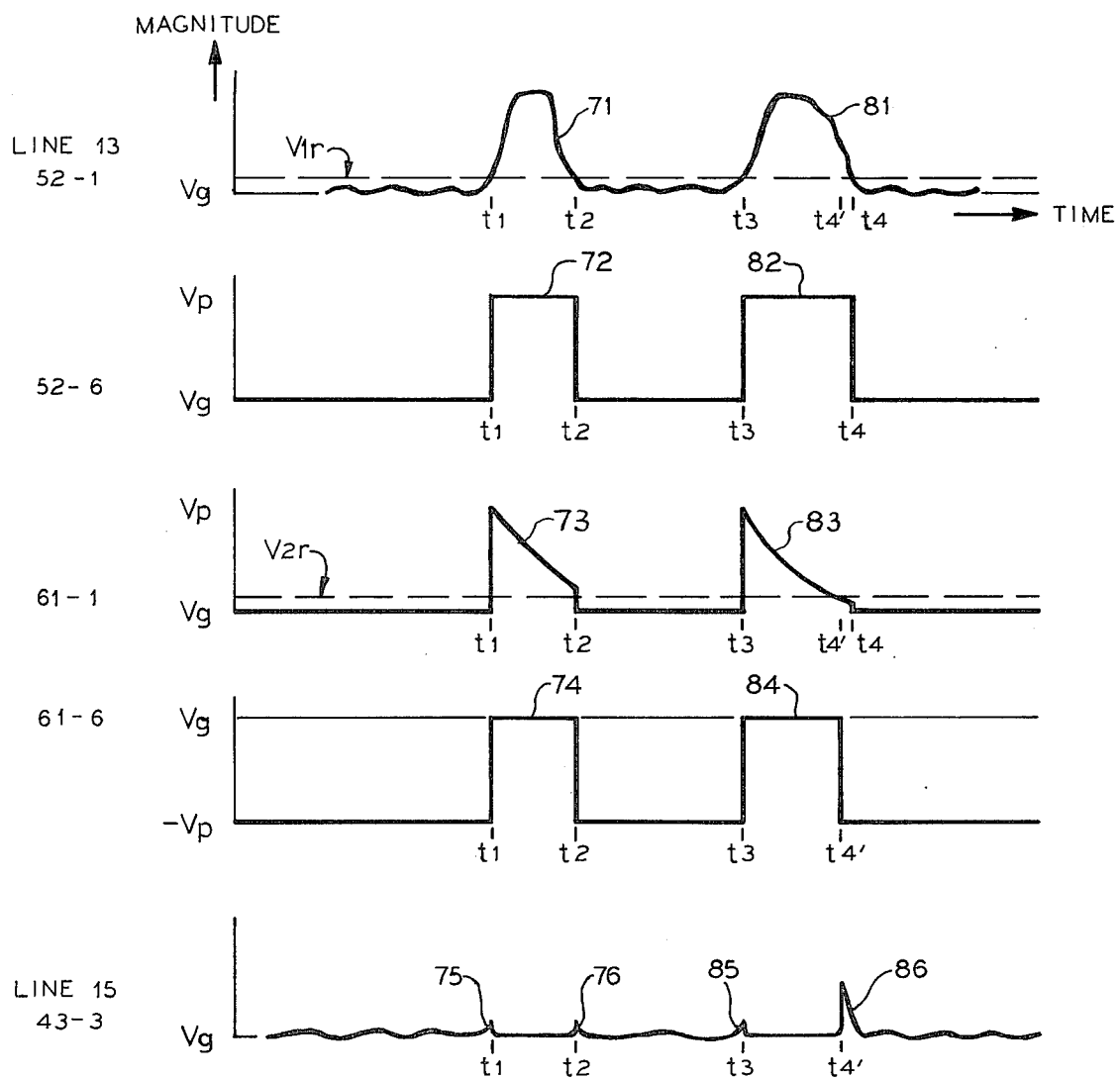
FIG. 4 is a wave form diagram of signals generated in the circuit of FIG. 3.

There is shown in FIG. 4 a wave form diagram of the signals generated in the circuit of FIG. 3. The signal on the signal conditioner circuit output line 13 fluctuates about the system ground potential Vg and is applied to the comparator input 52-1 to be compared with the first reference potential V1r shown as a dashed line. When a load signal 71 is generated on the line 13, the comparator 52 will generate a pulse 72 at the output 52-6 when the magnitude of the load signal exceeds the magnitude of the reference voltage V1r at the time t1. The output signal 72 has a magnitude Vp which is at or near the positive power supply potential. The leading edge of the pulse 72 is coupled through the capacitor 58 and is applied to the comparator input 61-1. As the capacitor 58 charges, the voltage at the input 61-1 decays toward the system ground potential Vg to form the pulse 73. The comparator responds to the pulse 73 by generating a control pulse 74 having the magnitude Vg. This control pulse turns on the transistor 68 at the time t1 to prevent the subsequent portion of the load signal 71 from generating a feedback signal at the amplifier output 43-3 on the line 15. Thus, only a small initial portion of the load signal before the time t1 generates a relatively small magnitude feedback signal 75.

If the magnitude of the load signal 71 falls below the magnitude of the first reference voltage V1r at time t2 before the magnitude of the signal 73 decays below the magnitude of the second reference signal V2r, the pulse 72 will be terminated at the time t2. The pulses 73 and 74 will also be terminated and the transistor 68 will be turned off such that the portion of the load signal subsequent to the time t2 will generate a relatively small magnitude feedback signal 76.

There is also shown in FIG. 4 a load signal 81 having a magnitude which exceeds the magnitude of the first reference voltage V1r for a period longer than the decay time of the pulse generated at the comparator input 61-1. The magnitude of the load signal 81 exceeds the V1r reference voltage magnitude at the time t3 to generate the pulse 82 at the comparator output 52-6, the pulse 83 at the comparator input 61-1 and the pulse 84 at the comparator output 61-6. Thus, only a small initial portion of the load signal before the time t3 generates a relatively small magnitude feedback signal 85.

At the time t4, the magnitude of the load signal 81 falls below the magnitude of the V1r reference voltage to terminate the pulse 82. However, before the time t4 at the time t4', the magnitude of the pulse 83 falls below the magnitude of the second reference voltage V2r to terminate the pulse 84. Thus, the transistor 68 is turned on and the portion of the load signal 81 subsequent to the time t4' generates a feedback signal 86 on the line 15.

In summary, the present invention concerns a means for interrupting a feedback path in a signal conditioning system. The signal conditioner circuit receives its input signal from a source which generates a signal having at least one signal pulse superimposed on a first d.c. voltage level. The signal conditioner circuit generates an output signal having a conditioned signal pulse superimposed on a second d.c. voltage level. A feedback means has an input connected to the signal conditioner output and an output connected to the signal conditioner input. The feedback means functions to generate a feedback signal which is utilized by the signal conditioner for establishing the second d.c. voltage level. The second d.c. voltage level is typically equal to the system ground potential.

The interrupting means includes a first means having one input connected to a source of a first reference voltage and another input connected to the signal conditioner output. The first means can be a voltage comparator which generates a predetermined magnitude output signal during the time the magnitude of the conditioned signal pulse exceeds the magnitude of the first reference voltage.

The signal differentiating means includes an RC network connected between the output of the first means and one input of a second means. Another input of the second means is connected to a source of a second reference voltage. The second means can be a voltage comparator which generates a predetermined magnitude control signal during the time the magnitude of the differential first means output signal exceeds the magnitude of a second reference voltage.

A means which is responsive to the control signal generated by the second means is provided to remove the conditioned signal pulse superimposed on the second d.c. voltage level from the feedback means input. This means can comprise an electronic switch such as a field effect transistor having a drain connected to the feedback means input, a source connected to a source of a system ground potential and a gate connected to receive the control signal from the second means output. The normally open electronic switch is closed during the time the magnitude of the differentiated first means output signal exceeds the magnitude of the second reference voltage to ground the feedback means input. The feedback means includes means for storing a charge to continue to establish the second d.c. voltage level during the time the feedback path is interrupted.

The present invention also concerns a method of conditioning a signal pulse superimposed on a first d.c. voltage level to generate a conditioned signal pulse superimposed on a second d.c. level. Included in the method are the steps of applying the first d.c. level and a feedback signal to a signal conditioner to generate the second d.c. voltage level; applying the second d.c. voltage level to a feedback circuit to generate the feedback signal; interrupting the feedback path during the time the magnitude of the signal pulse exceeds the magnitude of a first reference voltage; and restoring the feedback path if that time exceeds a predetermined time. The interrupting step also includes generating an output signal during the time, differentiating the output signal and interrupting the feedback path during the time the magnitude of the differentiated output signal exceeds the magnitude of a second reference voltage and wherein the restoring step includes restoring the feedback path when the magnitude of the differentiated output signal falls below the magnitude of the second reference voltage. The interrupting step further includes generating the feedback signal to the signal conditioner circuit during the time the feedback path is interrupted.

In accordance with the provisions of the patent statutes, the principle and mode of operation of the invention have been explained and illustrated in its preferred embodiment. However, it must be understood that the invention may be practiced otherwise than as specifically illustrated and described without departing from its spirit or scope.

What is claimed is:

1. Means for interrupting a feedback path in a signal conditioning system, the system including a source of an input signal having at least one signal pulse superimposed on a first d.c. voltage level, a signal conditioner circuit having an input connected to the input signal source and being responsive to the signal pulse for generating at an output a conditioned signal pulse superimposed on a second d.c. voltage level and a feedback means having an input connected to the signal conditioner output and an output connected to the signal conditioner input for establishing the second d.c. voltage level, the interrupting means comprising:
   a source of a first reference voltage;
   a first means having one input connected to said first reference voltage source and another input connected to the signal conditioner output for generating a signal at an output during the time the magnitude of the conditioned signal pulse exceeds the magnitude of said reference voltage;
   a signal differentiating means;
   a source of a second reference voltage;
   a second means having one input connected to said second reference voltage source and another input connected to the output of said first means through said signal differentiating means for generating a control signal at an output during the time the magnitude of the differentiated first means output signal exceeds the magnitude of said second reference voltage; and
   means connected to said second means output and to said feedback means input and responsive to said control signal for removing the conditioned signal pulse superimposed on the second d.c. level from said feedback means input wherein the feedback means continues to establish the second d.c. voltage level.

2. A system according to claim 1 wherein said second d.c. voltage level is the system ground potential.

3. A system according to claim 1 wherein said first means is a voltage comparator which generates said output signal at a predetermined magnitude.

4. A system according to claim 1 wherein said second means is a voltage comparator which generates said control signal at a predetermined magnitude.

5. A system according to claim 1 wherein said control signal responsive means is a normally turned off transistor switch connected between said another first means input and the system ground potential, said switch being turned on by said control signal to ground said another first means input thereby removing said conditioned signal pulse from said another first means input.

6. A system according to claim 5 wherein said transistor switch is a field effect transistor.

7. A system according to claim 1 wherein the feedback means includes means for storing a charge to continue to establish the second d.c. voltage level during the time the feedback path is interrupted.

8. A method of conditioning a signal pulse superimposed on a first d.c. voltage level to generate a conditioned signal pulse superimposed on a second d.c. voltage level, the method comprising the steps of:
   applying the first d.c. voltage level and a feedback signal to a signal conditioner circuit to generate the second d.c. voltage level;
   applying the second d.c. voltage level to a feedback circuit to generate said feedback signal;
   interrupting the applying of the feedback signal to said signal conditioner circuit during the time the magnitude of the signal pulse exceeds the magnitude of a first reference voltage; and
   restoring the feedback signal to said signal conditioner circuit if said time exceeds a predetermined time.

9. A method according to claim 8 wherein said interrupting step includes generating an output signal during said time, differentiating said output signal and interrupting the applying of the feedback signal to said signal conditioner circuit during the time the magnitude of the differentiated output signal exceeds the magnitude of a second reference voltage and wherein said restoring step includes restoring the feedback signal to said conditioner circuit when the magnitude of said differentiated output signal falls below the magnitude of said second reference voltage.

10. A method according to claim 8 wherein said interrupting step includes generally a signal representing the magnitude of said feedback signal at the beginning of said interrupting step to said signal conditioner circuit during said time the applying of the feedback signal to said signal conditioner circuit is interrupted.

* * * * *